(12) United States Patent
Jo et al.

(10) Patent No.: US 10,356,900 B2
(45) Date of Patent: Jul. 16, 2019

(54) CIRCUIT BOARD, DISPLAY DEVICE INCLUDING THE SAME, AND METHOD OF MANUFACTURING THE CIRCUIT BOARD

(71) Applicant: SAMSUNG DISPLAY CO., LTD., Yongin-si, Gyeonggi-do (KR)

(72) Inventors: Jung Yun Jo, Yongin-si (KR); Jeong Do Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/677,395

(22) Filed: Aug. 15, 2017

(65) Prior Publication Data

US 2018/0063953 A1 Mar. 1, 2018

(30) Foreign Application Priority Data

Sep. 1, 2016 (KR) .......................... 10-2016-0112457

(51) Int. Cl.
| | |
|---|---|
| *H05K 7/10* | (2006.01) |
| *H05K 7/12* | (2006.01) |
| *H05K 1/11* | (2006.01) |
| *H05K 3/18* | (2006.01) |
| *H05K 3/28* | (2006.01) |

(Continued)

(52) U.S. Cl.
CPC ............ *H05K 1/111* (2013.01); *H05K 3/188* (2013.01); *H05K 3/28* (2013.01); *H05K 3/4007* (2013.01); *H05K 1/0313* (2013.01); *H05K 1/09* (2013.01); *H05K 3/36* (2013.01); *H05K 2201/0314* (2013.01); *H05K 2201/0367* (2013.01); *H05K 2201/0939* (2013.01); *H05K 2201/09045* (2013.01); *H05K 2201/10128* (2013.01); *H05K 2201/10136* (2013.01); *H05K 2203/0723* (2013.01)

(58) Field of Classification Search
CPC ........ H05K 1/0313; H05K 1/09; H05K 1/111; H05K 2201/0314; H05K 2201/0367; H05K 2201/09045; H05K 2201/0939; H05K 2201/10128; H05K 2201/10136; H05K 2203/0723; H05K 3/188; H05K 3/28; H05K 3/36
See application file for complete search history.

(56) References Cited

U.S. PATENT DOCUMENTS 6,133,534 A * 10/2000 Fukutomi .......... G01R 1/07314
174/257
6,313,541 B1 * 11/2001 Chan ...................... H01L 24/05
257/786

(Continued)

FOREIGN PATENT DOCUMENTS

KR 10-2012-0016814 A 2/2012

*Primary Examiner* — Yuriy Semenenko
(74) *Attorney, Agent, or Firm* — Lewis Roca Rothgerber Christie LLP (57) ABSTRACT

A circuit board, a display device including the same, and a method of manufacturing a circuit board are provided. A circuit board includes a base substrate, a wiring line provided on the base substrate, a passivation layer provided on the wiring line, an elastic bump provided on the passivation layer, and a conductive layer provided on the elastic bump. The passivation layer includes a first opening and a second opening that expose a partial region of the wiring line, and the second opening is arranged in a region adjacent to the first opening.

18 Claims, 12 Drawing Sheets

(51) Int. Cl.
*H05K 3/40* (2006.01)
*H05K 1/03* (2006.01)
*H05K 1/09* (2006.01)
*H05K 3/36* (2006.01)

(56) References Cited

U.S. PATENT DOCUMENTS

| | | | |
|---|---|---|---|
| 7,166,920 B2 | 1/2007 | Saito et al. | |
| 8,674,232 B2 | 3/2014 | Cho et al. | |
| 9,245,865 B1* | 1/2016 | Kwon | H05K 1/0271 |
| 2005/0082686 A1* | 4/2005 | Liu | B23K 3/06 |
| | | | 257/780 |
| 2006/0153997 A1* | 7/2006 | Rankin, Jr. | C09K 19/02 |
| | | | 428/1.5 |
| 2007/0103632 A1* | 5/2007 | Chen | G02F 1/13452 |
| | | | 349/149 |
| 2008/0284011 A1* | 11/2008 | Chang | H01L 23/49811 |
| | | | 257/737 |
| 2009/0243093 A1* | 10/2009 | Chang | H01L 24/10 |
| | | | 257/737 |
| 2010/0163869 A1* | 7/2010 | Yang | H01L 22/30 |
| | | | 257/48 |
| 2011/0049725 A1* | 3/2011 | Topacio | H01L 24/03 |
| | | | 257/773 |
| 2014/0132150 A1* | 5/2014 | You | F21V 7/00 |
| | | | 313/504 |

* cited by examiner

CIRCUIT BOARD, DISPLAY DEVICE INCLUDING THE SAME, AND METHOD OF MANUFACTURING THE CIRCUIT BOARD

CROSS-REFERENCE TO RELATED APPLICATION

This application claims priority to and the benefit of Korean Patent Application No. 10-2016-0112457, filed on Sep. 1, 2016 in the Korean Intellectual Property Office, the entire content of which is incorporated herein by reference.

BACKGROUND

1. Field

Aspects of embodiments of the present invention relate to a circuit board, a display device including the same, and a method of manufacturing a circuit board.

2. Description of the Related Art

Recently, demands on various types of display devices are increasing. One of such display devices is a flexible display. The flexible display refers to a display device capable of implementing the same picture quality although being folded or bent. In order to implement such a display device, it is important to implement stable electrical connection between circuits.

In a conventional art, in order to implement stable electrical connection between circuits, an anisotropic conductive film is used. The anisotropic conductive film is positioned between bumps at ends of circuits and pads and electrically connects the bumps and pads. The anisotropic conductive film includes conductive particles that allow electrical conductivity. The conductive particles are formed of polymers and conductive bodies. Since the polymers in the conductive particles are elastic, the conductive particles have elasticity. Therefore, although the circuits are close to each other or remote from each other due to external force, the conductive particles are compressed and expanded so that the electrical connection between the circuits is maintained.

SUMMARY

According to an aspect of one or more embodiments of the present invention, a circuit board and/or a display device has a structure in which stable electrical connection may be formed among circuits.

According to one or more embodiments of the present invention, a circuit board includes a base substrate, a wiring line on the base substrate, a passivation layer on the wiring line, an elastic bump on the passivation layer, and a conductive layer on the elastic bump, wherein the passivation layer includes a first opening and a second opening that expose a partial region of the wiring line, and the second opening is arranged in a region adjacent to the first opening.

According to an embodiment of the present invention, the passivation layer covers the wiring line in a region corresponding to a region in which the elastic bump is provided.

According to an embodiment of the present invention, an area of the second opening is smaller than an area of the first opening.

According to an embodiment of the present invention, the second opening is spaced apart from the first opening.

According to an embodiment of the present invention, the second opening is arranged in a region adjacent to the first opening and is integrated with the first opening.

According to an embodiment of the present invention, the elastic bump includes at least one among polyethylene, polypropylene, polystyrene, polyvinyl chloride (PVC), polyester, polyurethane, polyamide, and polybutadiene.

According to an embodiment of the present invention, the elastic bump has an elasticity of 1.5 GPa to 10 GPa.

According to an embodiment of the present invention, the conductive layer includes at least one of Au, Ag, Pt, Cu, Mo, Al, W, Ti, Ta, and an alloy of any thereof.

According to an embodiment of the present invention, the wiring line includes a plurality of conductive layers.

According to an embodiment of the present invention, the circuit board further includes an insulating layer between the base substrate and the wiring line.

According to an embodiment of the present invention, an area of the elastic bump is smaller than areas of the first opening and the second opening.

According to one or more embodiments of the present invention, a display device includes a display substrate configured to display an image, a pad unit at a side of the display substrate, and a circuit board, and the circuit board includes a base substrate, a wiring line on the base substrate, a passivation layer on the wiring line, an elastic bump on the passivation layer, and a conductive layer on the elastic bump and electrically connected to the pad unit, wherein the passivation layer includes a first opening and a second opening arranged in a region adjacent to the first opening, the first opening and the second opening exposing a partial region of the wiring line.

According to an embodiment of the present invention, the display substrate includes an LCD device or an OLED.

According to an embodiment of the present invention, the passivation layer covers the wiring line in a region corresponding to a region in which the elastic bump is provided.

According to an embodiment of the present invention, the second opening is spaced apart from the first opening.

According to an embodiment of the present invention, the second opening is arranged in a region adjacent to the first opening and is integrated with the first opening.

According to one or more embodiments of the present invention, a method of manufacturing a circuit board includes providing a base substrate; forming a wiring line on the base substrate; forming a passivation layer having a first opening and a second opening on the wiring line; forming an elastic bump on the first opening and the second opening; and forming a conductive layer on the wiring line, the passivation layer, and the elastic bump.

According to an embodiment of the present invention, the first opening and the second opening are formed by patterning the passivation layer.

According to an embodiment of the present invention, the method may further include forming an insulating layer between the providing of the base substrate and the forming of the wiring line on the base substrate.

According to an embodiment of the present invention, the conductive layer is formed by electroplating.

According to an aspect of embodiments of the present invention, the circuit board and the display substrate may be stably connected without an anisotropic conductive film.

According to another aspect of embodiments of the present invention, a contact area between the conductive layer and the passivation layer increases such that allowable stress of the circuit board may be increased.

BRIEF DESCRIPTION OF THE DRAWINGS

In the drawing figures, dimensions may be exaggerated for clarity of illustration. Like reference numerals refer to like elements throughout.

DETAILED DESCRIPTION

Some example embodiments will now be described more fully hereinafter with reference to the accompanying drawings; however, the present invention may be embodied in different forms and should not be construed as limited to the embodiments set forth herein. Rather, these embodiments are provided so that this disclosure will be thorough and complete, and will full convey the scope of the present invention to those skilled in the art.

The present invention may be modified in various ways and may have various embodiments, particular examples of which will be illustrated in the drawings and described in further detail herein. However, it is to be understood that the present invention is not limited to a specific disclosed form, but includes all modifications, equivalents, and substitutions without departing from the scope and spirit of the present invention.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Hereinafter, some embodiments of the present invention will be described in more detail with reference to the accompanying drawings.

Figure 1:
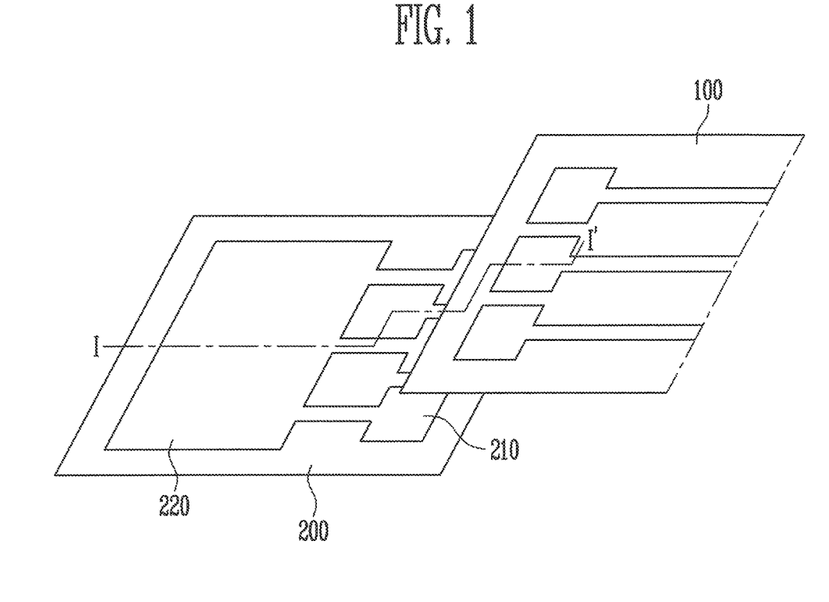
FIG. 1 is an exploded perspective view schematically illustrating a display device according to an embodiment of the present invention.

FIG. 1 is an exploded perspective view schematically illustrating a display device according to an embodiment of the present invention.

Referring to FIG. 1, a display device according to an embodiment of the present invention includes a display substrate 200 for displaying an image, a pad unit 210 provided at a side of the display substrate 200, a display unit 220, and a circuit board 100.

In an embodiment, the circuit board 100 includes a base substrate 110, a wiring line 120 provided on the base substrate 110, a passivation layer 130 provided on the wiring line 120, an elastic bump 140 provided on the passivation layer 130, and a conductive layer 150 provided on the elastic bump 140 and electrically connected to the pad unit 210.

Herein, elements of the circuit board 100 will be described in further detail.

The base substrate 110 forms a base of the circuit board 100. For example, a Si wafer may be used as the base substrate 110. However, the present invention is not limited thereto. For example, a material that forms the base substrate 110 may be properly selected in accordance with a purpose of a person skilled in the art.

The wiring line 120 is provided on the base substrate 110. The wiring line 120 is formed of a conductive material, such as a metal. The wiring line 120 transmits an electrical signal to the display substrate 200 through the conductive layer 150 or transmits an electrical signal from the display substrate 200 to the circuit board 100.

The passivation layer 130 is provided on the wiring line 120. The passivation layer 130 is formed of an insulating body. The passivation layer 130 may be formed of an organic material or an inorganic material. For example, the passivation layer 130 may be formed of at least one among a silicon nitride (SiNx), a silicon oxide (SiO$_2$), a silicon oxynitride (SiOxNy), polystyrene, polyvinyl chloride (PVC) polyester, polyurethane, polyamide, and polybutadiene. However, the present invention is not limited thereto. For example, a material that may be used as the passivation layer 130 may be properly selected in accordance with a purpose of a person skilled in the art.

The elastic bump 140 is provided on the passivation layer 130. In a conventional art, bumps are formed of metal filler and an elastic anisotropic conductive material is inserted between the bumps and pad units. However, according to embodiments of the present invention, since the elastic bump 140 provides elasticity to the bumps, an additional anisotropic conductive material is not required. A shape of the elastic bump 140 is not limited, and may be conical or hemispherical, for example. In particular, when the elastic bump 140 is conical, since the elastic bump 140 and the pad unit 210 do not make point contact but, rather, make surface contact, stable electrical connection may be formed between the elastic bump 140 and the pad unit 210. Since the elastic bump 140 has elasticity, the elastic bump 140 may be compressed when the elastic bump 140 and the pad unit 210 are close to each other and may expand when the elastic bump 140 and the pad unit 210 are remote from each other in a certain range.

The conductive layer 150 is provided on the elastic bump 140. The conductive layer 150 covers the wiring line 120 in a first opening 131 and a second opening 132, the passivation layer 130, and the elastic bump 140. The conductive layer 150 electrically connects the wiring line 120 of the circuit board 100 and the pad unit 210 of the display substrate 200. Therefore, the conductive layer 150 includes an electrically conductive material.

As described above, the passivation layer 130 covers the wiring line 120. However, the passivation layer 130 is not formed on a partial region of the wiring line 120. The region in which the wiring line 120 is exposed since the passivation layer 130 is not formed is referred to as the first opening 131 and the second opening 132. The second opening 132 is arranged around the first opening 131. Since the passivation layer 130 is not formed on the wiring line 120 in the first opening 131 and the second opening 132, the wiring line 120 and the elastic bump 140 or the wiring line 120 and the conductive layer 150 directly contact.

In the display device according to the present invention, various problems of a display device in which a conventional anisotropic conductive film is used are solved. The conventional anisotropic conductive film has various problems. First, as a semiconductor device is miniaturized and a degree of integration of the semiconductor device increases, it is difficult to use an anisotropic conductive film. This is because electrical connection may be formed between undesired circuits due to the anisotropic conductive film. In addition, electrical connection may be easily broken by external force. Since conductive particles in the anisotropic conductive film are spherical, point contact is formed between the anisotropic conductive film and the circuits. When the point contact is formed between the anisotropic conductive film and the circuits, a contact area in which the electrical connection may be formed is reduced and stability of the electrical connection may be reduced.

According to embodiments of the present invention, the problems of the conventional anisotropic conductive film are solved by providing the circuit board 100.

In FIG. 1, the display device in which the circuit board 100 and the pad unit 210 are electrically connected is provided. The pad unit 210 is electrically connected to the conductive layer 150 formed on the circuit board 100. In FIG. 1, it is illustrated that three pad units 210 exist, and three bumps exist at the end of the circuit board 100. However, the numbers of pad units 210 and bumps are not limited thereto.

Figure 2:
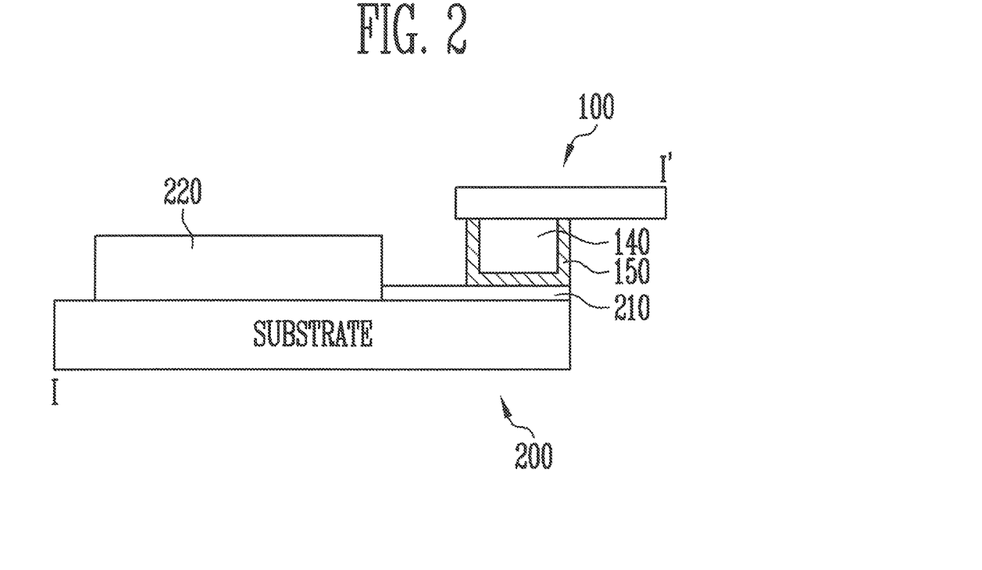
FIG. 2 is a cross-sectional view of the display device of FIG. 1, taken along the line I-I'.

FIG. 2 is a cross-sectional view of the display device of FIG. 1, taken along the line I-I' of FIG. 1. In FIG. 1, it is illustrated that the display substrate 200 and the circuit board 100 are spaced apart from each other. However, in FIG. 2, it is illustrated that the display substrate 200 and the circuit board 100 contact each other in order to provide a connection relationship between the display substrate 200 and the circuit board 100. In FIG. 2, the pad unit 210 is provided at a side of the display substrate 200. The pad unit 210 contacts and is electrically connected to the conductive layer 150 of the circuit board 100. The elastic bump 140 under the conductive layer 150 may be compressed or expanded more than shown in FIG. 2 in accordance with relative positions of the display substrate 200 and the circuit board 100. Therefore, although the positions of the display substrate 200 and the circuit board 100 may vary, electrical connection may be maintained between the conductive layer 150 and the pad unit 210.

The electrical signal may be transmitted from the display substrate 200 to the circuit board 100 or from the circuit board 100 to the display substrate 200 through the pad unit 210. In accordance with the received electrical signal, the display substrate 200 outputs an image that the display device is to provide. In an embodiment, the display substrate 200 may include a liquid crystal display (LCD) device or an organic light emitting diode (OLEO), for example.

Figure 3:
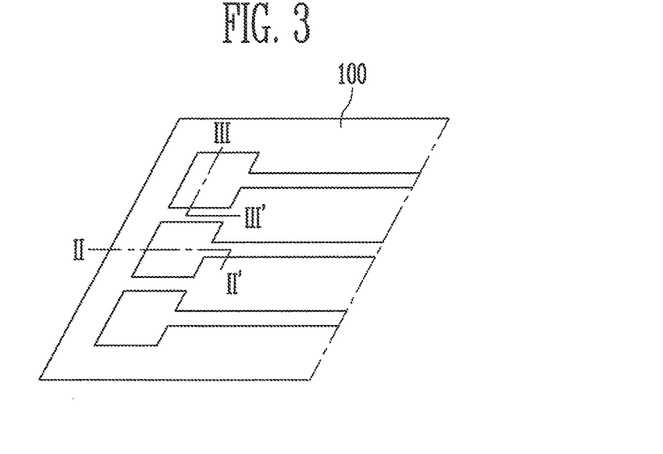
FIG. 3 is a perspective view schematically illustrating a circuit board according to an embodiment of the present invention.

FIG. 3 is a perspective view schematically illustrating the circuit board 100 according to an embodiment of the present invention, in which the circuit board 100 of FIG. 1 is shown enlarged.

Figure 4:
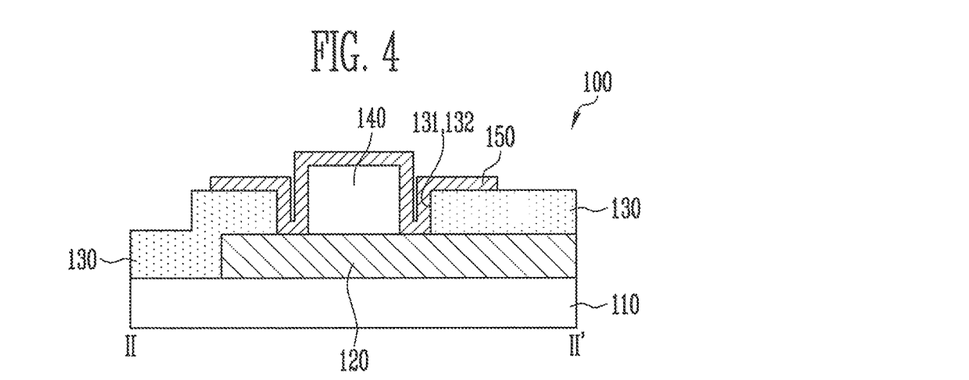
FIG. 4 is a cross-sectional view of the circuit board of FIG. 3, taken along the line II-II'.

FIG. 4 is a cross-sectional view of the circuit board 100, taken along the line II-II' of FIG. 3. Referring to FIG. 4, the base substrate 110, the wiring line 120 formed on the base substrate 110, the passivation layer 130 formed on the wiring line 120, the elastic bump 140 formed on the passivation layer 130, the conductive layer 150 formed on the elastic bump 140, and the first opening 131 and the second opening 132 are provided.

In FIG. 4, a part of the conductive layer 150 is directly connected to the wiring line 120. This is because a length of the first opening 131 is larger than a length of the elastic bump 140, as seen along the line II-II'.

Figure 5:
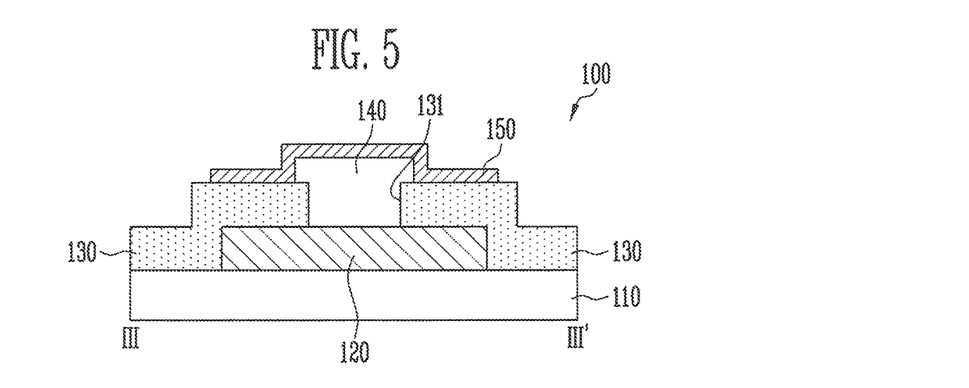
FIG. 5 is a cross-sectional view of the circuit board of FIG. 3, taken along the line III-III'.

FIG. 5 is a cross-sectional view of the circuit board 100, taken along the line III-III' of FIG. 3. In FIG. 5, the elastic bump 140 covers a part of the passivation layer 130. This is because a length of the first opening 131 is smaller (e.g., much smaller) than a length of the elastic bump 140, as seen along the line III-III'.

Figure 6A:
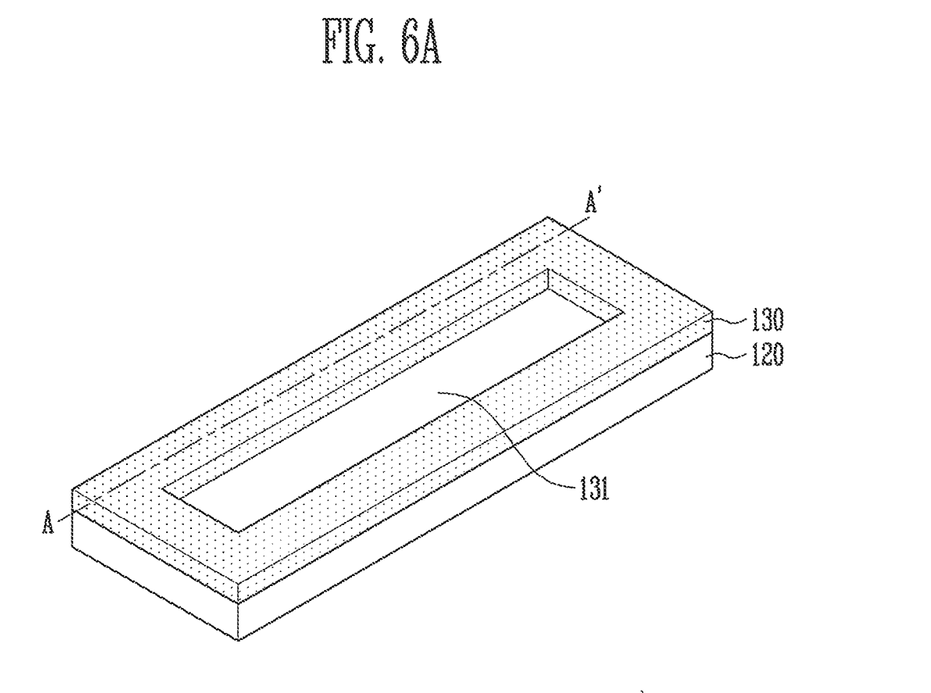
FIG. 6A is a perspective view of a circuit board in which a first opening is formed according to an embodiment of the present invention.
Figure 6B:
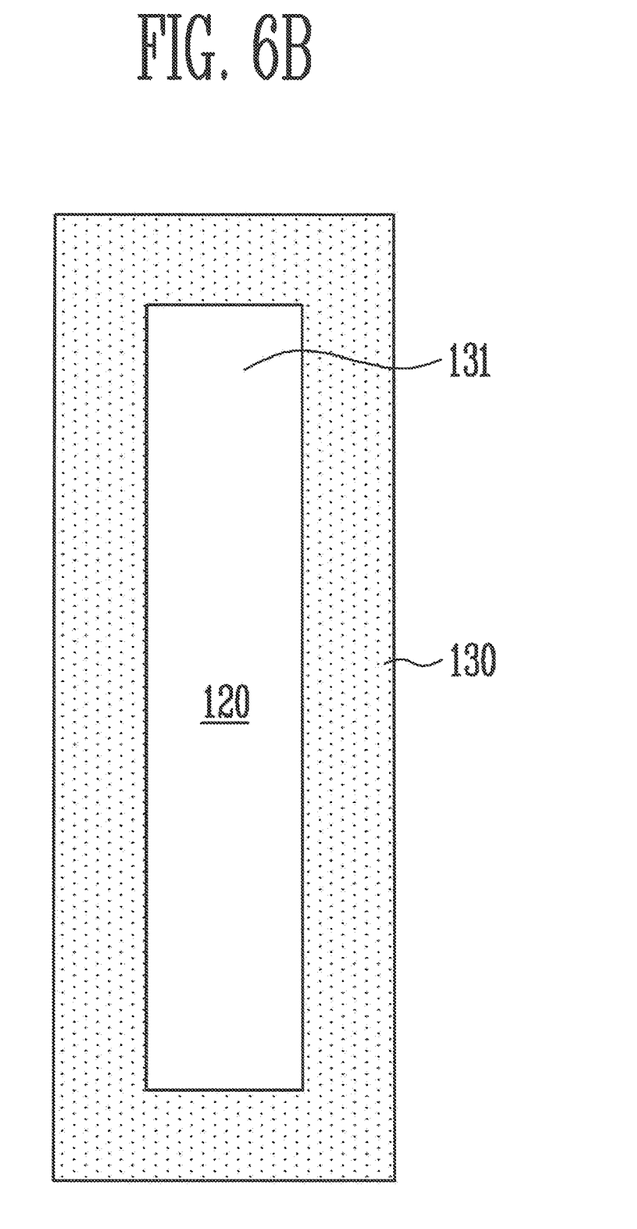
FIG. 6B is a plan view of the circuit board of FIG. 6A.
Figure 6C:
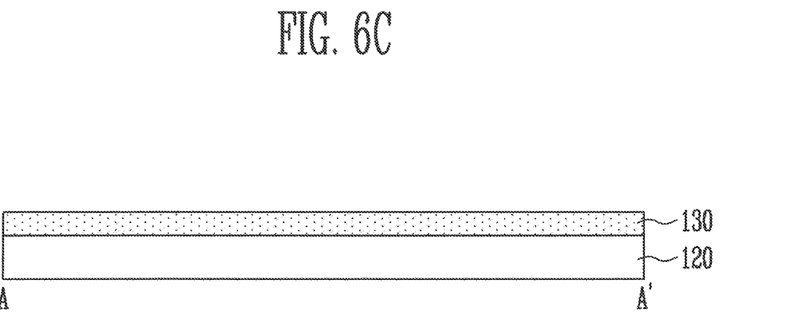
FIG. 6C is a cross-sectional view of the circuit board of FIG. 6A, taken along the line A-A'.

FIG. 6A is a perspective view of the circuit board 100 in which the first opening 131 is formed. FIG. 6B is a plan view of the circuit board 100 in which the first opening 131 is formed. FIG. 6C is a cross-sectional view of the circuit board 100, taken along the line A-A' of FIG. 6A.

In FIGS. 6A through 6C, the base substrate 110, the elastic bump 140, and the conductive layer 150 are not illustrated. Although the above elements are not shown in order to illustrate a shape of the first opening 131, the circuit board 100 includes the base substrate 110, the elastic bump 140, and the conductive layer 150.

As illustrated in FIGS. 6A and 6B, the first opening 131 is formed and the second opening 132 is not formed in the passivation layer 130, and, therefore, an internal outline of the passivation layer 130 may be rectangular.

Referring to FIG. 6C, an interface between the wiring line 120 and the passivation layer 130 may be clearly seen. It is noted that, in an embodiment, there are no curves in the passivation layer 130. Therefore, it is noted that, in an embodiment, there are no curves in the conductive layer 150 formed on the passivation layer 130.

Figure 7A:
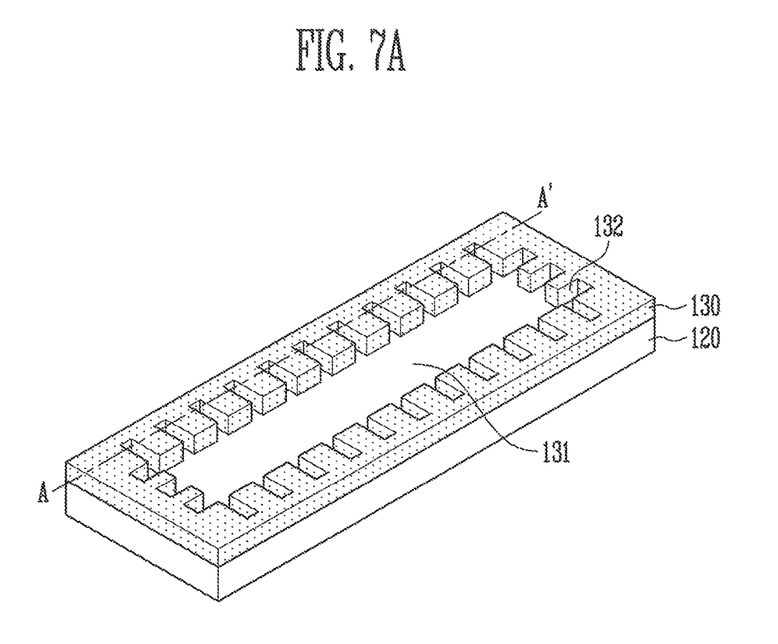
FIG. 7A is a perspective view of a circuit board according to an embodiment of the present invention.
Figure 7B:
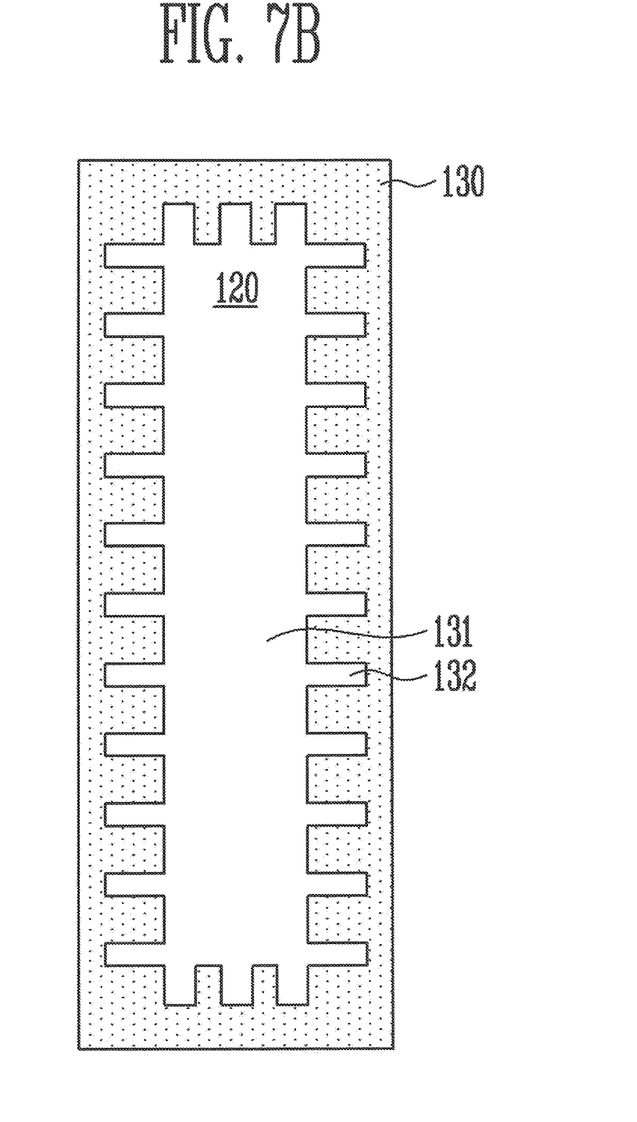
FIG. 7B is a plan view of the circuit board of FIG. 7A.
Figure 7C:
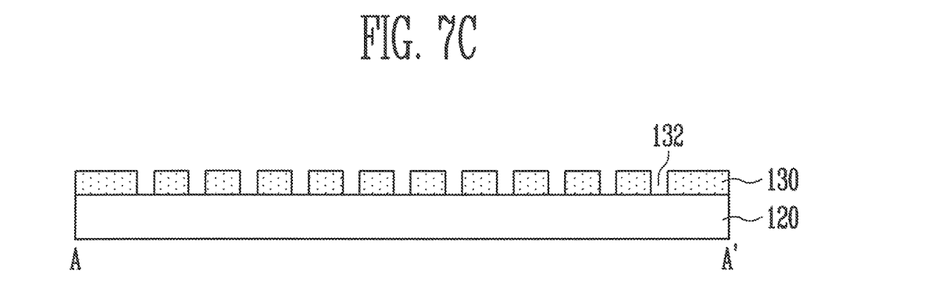
FIG. 7C is a cross-sectional view of the circuit board of FIG. 7A, taken along the line B-B'.

FIG. 7A is a perspective view of the circuit board 100 in which the first opening 131 and the second opening 132 are formed. FIG. 7B is a plan view of the circuit board 100 in which the first opening 131 and the second opening 132 are formed. FIG. 7C is a cross-sectional view taken along the line A-A' of FIG. 7A. According to the embodiment of the present invention disclosed in FIGS. 7A through 7C, the second opening 132 is arranged in a region adjacent to the first opening 131 and may be integrated with the first opening 131.

In FIGS. 7A through 7C, the base substrate 110, the elastic bump 140, and the conductive layer 150 are not illustrated. Although the above elements are not shown in order to illustrate shapes of the first opening 131 and the second opening 132, the circuit board 100 includes the base substrate 110, the elastic bump 140, and the conductive layer 150.

According to an embodiment of the present invention, since the first opening 131 and the second opening 132 are provided, a contact area between the passivation layer 130 and the conductive layer 150 may be increased.

As illustrated in FIGS. 7A and 7B, the first opening 131 and the second opening 132 are formed in the passivation layer 130. Therefore, in an embodiment, an internal outline of the passivation layer 130 is saw-toothed.

Referring to FIG. 7C, an interface between the wiring line 120 and the passivation layer 130 may be clearly seen. In an embodiment, the conductive layer 150 formed on the passivation layer 130 has curves or steps along the passivation layer 130. Therefore, in an embodiment, the interface between the passivation layer 130 and the conductive layer 150 has curves or steps. Such curves or steps increase the contact area between the passivation layer 130 and the conductive layer 150.

The contact area between the passivation layer 130 and the conductive layer 150 is related to the allowable stress of the circuit board 100. The allowable stress means maximum shear stress against which the conductive layer 150 is not ripped or separated from the circuit board 100. That is, when shear stress of no less than the allowable stress is applied to the circuit board 100, the conductive layer 150 may be ripped or separated from the circuit board 100. When the conductive layer 150 is ripped or separated from the circuit board 100, the circuit board 100 may not be electrically connected to the pad unit 210 of the display substrate 200. In order to increase the allowable stress of the circuit board 100, the conductive layer 150 and the passivation layer 130 or the conductive layer 150 and the elastic bump 140 should tightly adhere to each other. Adhesiveness between the conductive layer 150 and the passivation layer 130 is high, and adhesiveness between the conductive layer 150 and the elastic bump 140 is low. A difference between the adhesiveness between the conductive layer 150 and the passivation layer 130 and the adhesiveness between the conductive layer 150 and the elastic bump 140 may be checked by measuring the allowable stress. Specifically, the allowable stress is measured by measuring force applied to a blade when a bump is ripped or separated while pushing the bump by the blade. A bump formed of gold (Au) that is one of materials of the conductive layer 150 without the elastic bump 140 has allowable stress of about 72 mN. A bump having both the elastic bump 140 and the conductive layer 150 has allowable stress of about 34 mN. This is because the contact area between the conductive layer 150 and the passivation layer 130 is reduced by an area occupied by the elastic bump 140. From the above result, it may be noted that the adhesiveness between the conductive layer 150 and the passivation layer 130 is high. In addition, it may be noted that adhesiveness between the elastic bump 140 and the conductive layer 150 and adhesiveness between the elastic bump 140 and the passivation layer 130 are low.

Therefore, it is possible to tightly adhere the conductive layer 150 to the circuit board 100 and to increase the allowable stress of the circuit board 100 by maximizing or increasing the contact area between the conductive layer 150 and the passivation layer 130.

Figure 8:
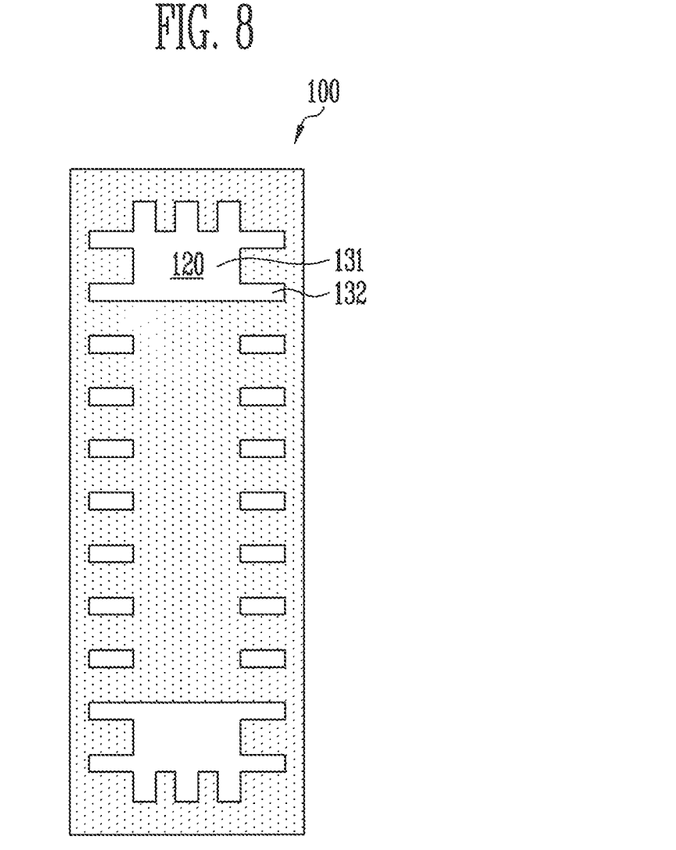
FIG. 8 is a plan view of a circuit board including a passivation layer according to another embodiment of the present invention.

FIG. 8 is a plan view of a circuit board including a passivation layer according to another embodiment of the present invention. According to the embodiment of the present invention disclosed in FIG. 8, the passivation layer 130 may cover the wiring line 120 in a region corresponding to a region in which the elastic bump 140 is provided. In this case, the elastic bump 140 and the wiring line 120 do not directly contact and the elastic bump 140 is formed only on the passivation layer 130. When the wiring line 120 in the region corresponding to the region in which the elastic bump 140 is provided is not exposed, the wiring line 120 may be protected against external influences.

According to an embodiment, an area of the second opening 132 is smaller than an area of the first opening 131. As described above, the second opening 132 increases the contact area between the passivation layer 130 and the conductive layer 150 together with the first opening 131. Therefore, an area of the second opening 132 is smaller than an area of the first opening 131 and more second openings 132 than the first opening 131 may be provided since the interface between the passivation layer 130 and the conductive layer 150 has larger curves, and the contact area between the passivation layer 130 and the conductive layer 150 increases as the area of the second opening 132 is reduced and the number of second openings 132 increases.

Figure 9:
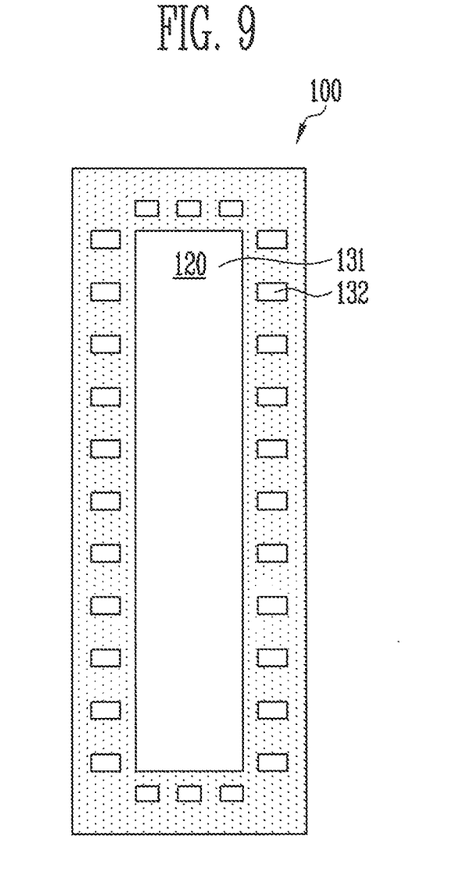
FIG. 9 is a plan view of a circuit board including a passivation layer according to another embodiment of the present invention.

FIG. 9 is a plan view of a circuit board including a passivation layer according to another embodiment of the present invention. According to the embodiment of the present invention disclosed in FIG. 9, the second openings 132 may be spaced apart from the first opening 131. In this case, the passivation layer 130 exists between the second openings 132 and the first opening 131.

According to an embodiment of the present invention, the elastic bump 140 may include at least one of polyethylene, polypropylene, polystyrene, polyvinyl chloride (PVC), polyester, polyurethane, polyamide, and polybutadiene. The elastic bump 140 should be able to contract or expand in accordance with positions of the circuit board 100 and the display substrate 200. Therefore, a thermoplastic elastomer capable of having the same elasticity as a thermo-hardening rubber at normal temperature may be included. Since the thermoplastic elastomer may be molded like a thermoplastic plastic, the thermoplastic elastomer has high processability.

The elastic bump 140 may have an elasticity of about 1.5 GPa to about 10 GPa. When the elastic bump 140 has an elasticity smaller than 1.5 GPa, the elastic bump 140 may not sufficiently contract or expand in accordance with the positions of the circuit board 100 and the display substrate 200. In addition, when the elastic bump 140 has an elasticity larger than 10 GPa, the elastic bump 140 may be greatly shaken by a small shock. In both cases, stability of electrical connection between the circuit board 100 and the display substrate 200 may deteriorate.

According to an embodiment of the present invention, the conductive layer 150 may include at least one of Au, silver (Ag), platinum (Pt), copper (Cu), molybdenum (Mo), aluminum (Al), tungsten (W), titanium (Ti), tantalum (Ta), and an alloy of Au, Ag, Pt, Cu, Mo, Al, W, Ti, and Ta. Since the conductive layer 150 electrically connects the pad unit 210 of the display substrate 200 and the wiring line 120 of the circuit board 100, electrical resistances of the above metals may be small. Since the metals have the small electrical resistances, electrical connection may be stably formed between the pad unit 210 and the wiring line 120.

According to an embodiment of the present invention, the wiring line 120 may include a plurality of conductive layers. The conductive layers may include different materials. In an embodiment, for example, a first conductive layer includes Au and a second conductive layer may include Ti. The conductive layers may extend from different regions of the circuit board.

According to an embodiment of the present invention, an insulating layer may be further provided between the base substrate 110 and the wiring line 120. The insulating layer may be formed of at least one among SiNx, $SiO_2$, and SiOxNy. The insulating layer prevents or substantially prevents impurity atoms from permeating and planarizes a substrate surface.

According to an embodiment of the present invention, an area of the elastic bump 140 may be smaller than areas of the first opening 131 and the second opening 132. In an embodiment, since an area of the elastic bump 140 is smaller than areas of the first opening 131 and the second opening 132, the wiring line 120 and the conductive layer 150 may be directly connected. Therefore, regardless of conductivity of the elastic bump 140, the wiring line 120 and the conductive layer 150 may be electrically connected.

Figure 10:
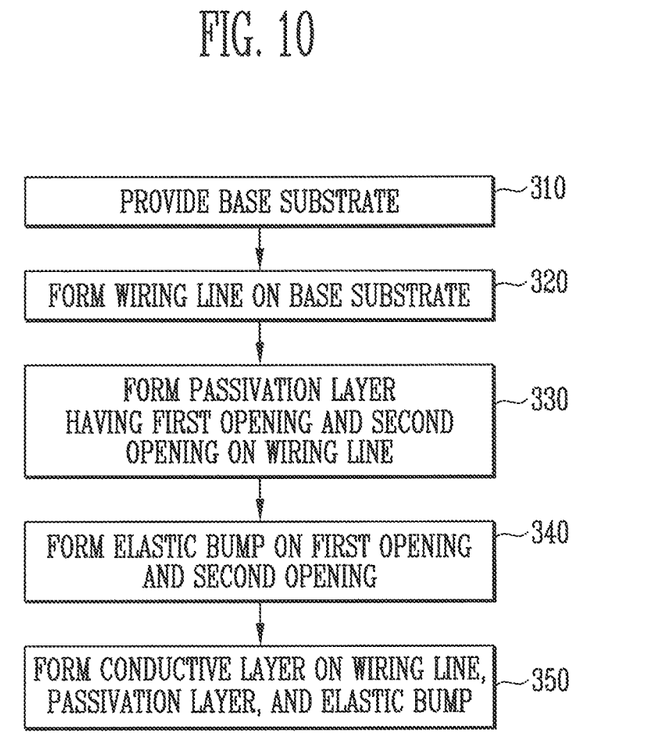
FIG. 10 is a flowchart illustrating a method of manufacturing a circuit board, according to an embodiment of the present invention.

According to an embodiment of the present invention, as illustrated in FIG. 10, a method of manufacturing the circuit board 100 is provided. The method includes providing the base substrate 110 (operation 310), forming the wiring line 120 on the base substrate 110 (operation 320), forming the passivation layer 130 having the first opening 131 and the second opening 132 on the wiring line 120 (operation 330), forming the elastic bump 140 on the first opening 131 and the second opening 132 (operation 340), and forming the conductive layer 150 on the wiring line 120, the passivation layer 130, and the elastic bump 140 (operation 350).

First, in an embodiment, in the providing of the base substrate 110 (the operation 310), the base substrate 110 may be provided by dicing a Si wafer. However, since a size and a kind of the base substrate 110 are not limited, a person skilled in the art may properly process a substrate suitable for a purpose and may use the processed substrate as the base substrate 110.

Then, the providing of the wiring line 120 on the base substrate 110 (the operation 320) will be described. The wiring line 120 may be formed of a conductive layer or a plurality of conductive layers. When only one conductive layer exists, the wiring line 120 may be formed by depositing the conductive layer on the base substrate 110 and patterning the deposited conductive layer. When the wiring line 120 is formed of the plurality of conductive layers, the wiring line 120 may be formed by depositing the plurality of conductive layers on the base substrate 110 and patterning the deposited conductive layers at one time. However, a method of forming the wiring line 120 is not limited to deposition and patterning. A person skilled in the art may use methods other than the deposition and patterning in order to provide the wiring line 120 on the base substrate 110.

Then, the forming of the passivation layer 130 having the first opening 131 and the second opening 132 on the wiring line 120 (the operation 330) will be described. The passivation layer 130, the first opening 131, and the second opening 132 may be concurrently (e.g., simultaneously) or sequentially formed. In an embodiment, when the passivation layer 130, the first opening 131, and the second opening 132 are sequentially formed, first, the passivation layer 130 is formed on an entire region of the wiring line 120. A photosensitive mask is attached onto the passivation layer 130 and light is irradiated onto a region excluding a region in which the first opening 131 and the second opening 132 are to be formed. Then, where the mask that exists on the region in which the first opening 131 and the second opening 132 are to be formed, the passivation layer 130 is removed by performing etching. When the sequential process is used, shapes of the first opening 131 and the second opening 132 may be easily changed by only changing a mask pattern.

Then, the forming of the elastic bump 140 on the first opening 131 and the second opening 132 (the operation 340) will be described. The elastic bump 140 is formed on the first opening 131 and the second openings 132. When the elastic bump 140 is formed of the thermoplastic elastomer, the elastic bump 140 may be formed by only placing melted polymers on the first opening 131 and the second opening 132 and cooling the polymers.

Then, the forming of the conductive layer 150 on the wiring line 120, the passivation layer 130, and the elastic bump 140 (the operation 350) will be described. When the conductive layer 150 includes at least one of Au, Ag, Pt, Cu, Mo, Al, W, Ti, Ta, and an alloy of any of these metals, the conductive layer 150 may be formed by electroplating. When the conductive layer 150 is formed by using the electroplating, the conductive layer 150 having a uniform thickness may be formed. In addition, adhesiveness between the conductive layer 150 and other elements is higher than when another method is used. However, the method of forming the conductive layer 150 is not limited to the electroplating. A person skilled in the art may use a proper forming method in accordance with the material of the conductive layer 150.

According to an embodiment of the present invention, forming an insulating layer may be further included between the providing of the base substrate 110 and the forming of the wiring line 120. Since a method of forming the insulating layer is not limited, a person skilled in the art may adopt a proper method in accordance with a material of the insulating layer.

Some example embodiments have been disclosed herein, and although specific terms are employed, they are used and are to be interpreted in a generic and descriptive sense only, and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A circuit board comprising:
   a base substrate;
   a wiring line on the base substrate;
   a passivation layer on the wiring line;
   an elastic bump on the passivation layer; and
   a conductive layer on the elastic bump,
   wherein the passivation layer comprises a first opening and a second opening that expose a partial region of the wiring line, and
   wherein the second opening is arranged in a region adjacent to the first opening and comprises a plurality of openings including at least one opening that is between and spaced apart from opposite ends of the first opening.

2. The circuit board of claim 1, wherein the passivation layer covers the wiring line in a region adjacent to a region in which the elastic bump is provided.

3. The circuit board of claim 1, wherein an area of the second opening is smaller than an area of the first opening.

4. The circuit board of claim 1, wherein the second opening is spaced apart from the first opening.

5. The circuit board of claim 1, wherein the second opening is arranged in a region adjacent to the first opening and is integrated with the first opening.

6. The circuit board of claim 1, wherein the elastic bump comprises at least one selected from the group consisting of polyethylene, polypropylene, polystyrene, polyvinyl chloride (PVC), polyester, polyurethane, polyamide, and polybutadiene.

7. The circuit board of claim 1, wherein an elastic modulus of the elastic bump is within a range of from 1.5 GPa to 10 GPa.

8. The circuit board of claim 1, wherein the conductive layer comprises at least one selected from the group consisting of Au, Ag, Pt, Cu, Mo, Al, W, Ti, Ta, and an alloy of any thereof.

9. The circuit board of claim 1, wherein the wiring line comprises a plurality of conductive layers.

10. The circuit board of claim 1, wherein a length of the elastic bump along a first direction is smaller than a length of the first opening along the first direction.

11. A display device comprising:
a display substrate configured to display an image;
a pad unit at a side of the display substrate; and
a circuit board,
wherein the circuit board comprises:
    a base substrate;
    a wiring line on the base substrate;
    a passivation layer on the wiring line;
    an elastic bump on the passivation layer; and
    a conductive layer on the elastic bump and electrically connected to the pad unit,
wherein the passivation layer comprises a first opening and a second opening arranged in a region adjacent to the first opening and comprising a plurality of openings including at least one opening that is between and spaced apart from opposite ends of the first opening, the first opening and the second opening exposing a partial region of the wiring line.

12. The display device of claim 11, wherein the display substrate comprises an LCD device or an OLED.

13. The display device of claim 11, wherein the passivation layer covers the wiring line in a region adjacent to a region in which the elastic bump is provided.

14. The display device of claim 11, wherein the second opening is spaced apart from the first opening.

15. The display device of claim 11, wherein the second opening is arranged in a region adjacent to the first opening and is integrated with the first opening.

16. A method of manufacturing a circuit board, the method comprising:
providing a base substrate;
forming a wiring line on the base substrate;
forming a passivation layer having a first opening and a second opening on the wiring line, wherein the first opening and the second opening expose a partial region of the wiring line, and the second opening is arranged in a region adjacent to the first opening and comprises a plurality of openings including at least one opening that is between and spaced apart from opposite ends of the first opening;
forming an elastic bump on the passivation layer and the first opening and the second opening; and
forming a conductive layer on the wiring line, the passivation layer, and the elastic bump.

17. The method of claim 16, wherein the first opening and the second opening are formed by patterning the passivation layer.

18. The method of claim 16, wherein the conductive layer is formed by electroplating.

* * * * *